United States Patent [19]

Inada et al.

[11] Patent Number: 5,430,013
[45] Date of Patent: Jul. 4, 1995

[54] SUPERCONDUCTING THIN FILM FORMED OF OXIDE SUPERCONDUCTOR MATERIAL, SUPERCONDUCTING CURRENT PATH AND SUPERCONDUCTING DEVICE UTILIZING THE SUPERCONDUCTING THIN FILM

[75] Inventors: Hiroshi Inada; Michitomo Iiyama, both of Osaka, Japan

[73] Assignee: Sumitomo Electric Industries, Ltd., Osaka, Japan

[21] Appl. No.: 327,883

[22] Filed: Oct. 24, 1994

Related U.S. Application Data

[63] Continuation of Ser. No. 948,749, Sep. 24, 1992, abandoned.

[30] Foreign Application Priority Data

Sep. 24, 1991 [JP] Japan .................................. 3-272158
Sep. 24, 1991 [JP] Japan .................................. 3-272159

[51] Int. Cl.⁶ ..................... H01L 39/00; H01L 39/24; H01B 12/06
[52] U.S. Cl. .................................. 505/235; 505/238; 505/704; 505/193; 505/703; 257/34; 257/38; 257/661; 257/39; 257/662
[58] Field of Search ...................... 257/38, 39, 31, 32, 257/33, 34, 35, 36, 37, 661, 662, 663; 505/150, 190, 220, 230, 231, 232, 235, 236, 329, 330, 430, 701, 702, 703, 704, 706, 812, 813, 832, 856, 862, 864, 861, 865, 866, 873, 874, 922, 423

[56] References Cited

U.S. PATENT DOCUMENTS 5,087,605  2/1992  Hedge et al. .......................... 257/33
5,236,896  8/1993  Nakamura et al. .................... 257/39

FOREIGN PATENT DOCUMENTS 0478465   4/1992  European Pat. Off. .............. 257/39
6439084   2/1984  Japan ................................... 257/33
91/18423 11/1991  WIPO.

OTHER PUBLICATIONS

Tarutani et al., "Superconducting Characteristics of a Planar-Type $HoBa_2Cu_3O_{7-x}-La_{1.5}Ba_{1.5}Cu_3O_{7-y}-HoBa_2Cu_3O_{7-x}$ Junction", Appl. Phys. Lett. 58 (23), Jun. 10, 1991, pp. 2707–2709.

Kasai, M. et al, "Current-Voltage Characteristics of $YBa_2Cu_3O_y/La_{0.7}Ca_{0.3}MnO_2/YBa_2Cu_3O_y$ Trilayered-Type Junctions", *Japanese Journal of Applied Physics*, vol. 29, No. 12: pp. L2219–2222, Dec., 1990.

Kozono, Y. et al, "Novel Proximity Effect Between High-Tc Superconductor and Magnetic Manganese Oxide", *Physica, C*, vol. 185, Pt. 3: pp. 1919–1920, 1 Dec. 1991.

Char, K. et al, "Bi-epitaxial Grain Boundary Junctions in $YBa_2Cu_3O_7$", *Applied Physics Letters*, vol. 59, No. 6: pp. 733–735, 5 Aug. 1991.

*Primary Examiner*—Jerome Jackson
*Assistant Examiner*—Alice W. Tang
*Attorney, Agent, or Firm*—Foley & Lardner

[57] ABSTRACT

A superconducting thin film formed on a substrate, comprising an a-axis orientated oxide superconductor layer, a c-axis orientated oxide superconductor layer and an oxide semiconductor layer inserted between the a-axis orientated oxide superconductor layer and the c-axis orientated oxide superconductor layer, in contact with them in which superconducting current can flow between the a-axis orientated oxide superconductor layer and the c-axis orientated oxide superconductor layer through the oxide semiconductor layer by a long-range proximity effect.

9 Claims, 2 Drawing Sheets

FIGURE 1A

10 SUBSTRATE

FIGURE 1B

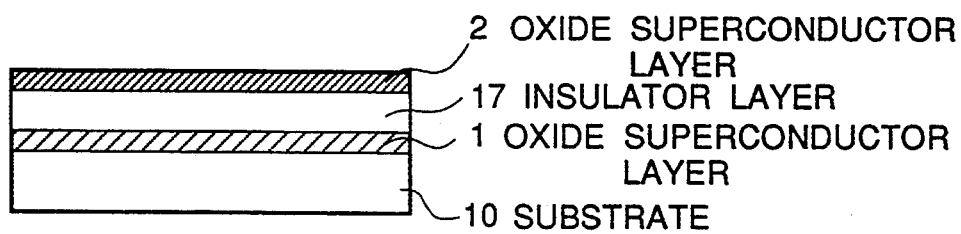
2 OXIDE SUPERCONDUCTOR LAYER
17 INSULATOR LAYER
1 OXIDE SUPERCONDUCTOR LAYER
10 SUBSTRATE

FIGURE 1C

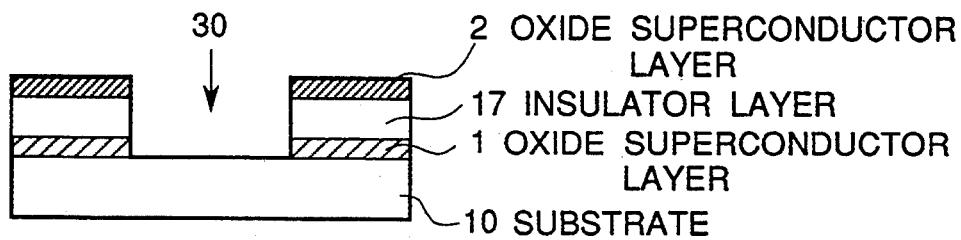
30
2 OXIDE SUPERCONDUCTOR LAYER
17 INSULATOR LAYER
1 OXIDE SUPERCONDUCTOR LAYER
10 SUBSTRATE

FIGURE 1D

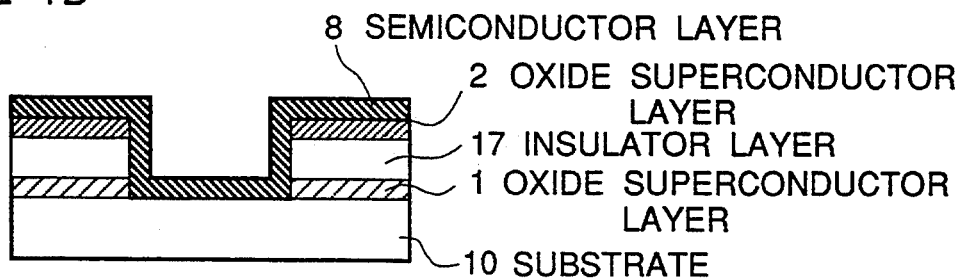
8 SEMICONDUCTOR LAYER
2 OXIDE SUPERCONDUCTOR LAYER
17 INSULATOR LAYER
1 OXIDE SUPERCONDUCTOR LAYER
10 SUBSTRATE

FIGURE 1E

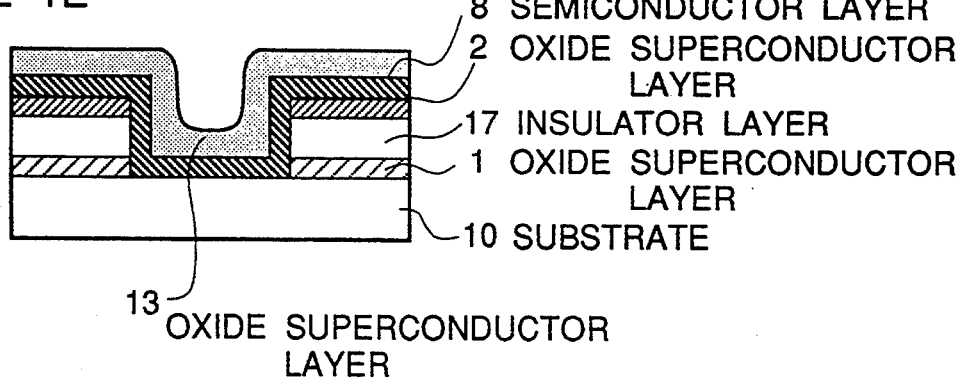
8 SEMICONDUCTOR LAYER
2 OXIDE SUPERCONDUCTOR LAYER
17 INSULATOR LAYER
1 OXIDE SUPERCONDUCTOR LAYER
10 SUBSTRATE
13 OXIDE SUPERCONDUCTOR LAYER

SUPERCONDUCTING THIN FILM FORMED OF OXIDE SUPERCONDUCTOR MATERIAL, SUPERCONDUCTING CURRENT PATH AND SUPERCONDUCTING DEVICE UTILIZING THE SUPERCONDUCTING THIN FILM

This application is a continuation of application Ser. No. 07/948,749, filed Sep. 24, 1992, now abandoned.

BACKGROUND OF THE INVENTION

1. Field of the Invention

The present invention relates to a superconducting thin film, a superconducting current path and a superconducting device which utilize the superconducting thin film. More specifically to a superconducting thin film formed of oxide superconductor material, a superconducting current path and a superconducting device utilizing the superconducting thin film.

2. Description of Related Art

A superconducting current path is one of the electronic applications of a superconductor. If all the current paths of a conventional electronic circuit including semiconductor devices is replaced with superconducting current paths, completely, the electronic circuit will operate rapidly with low power consumption. Superconducting signal paths are also expected to reduce the wave form distortion so that the required number of amplifiers can be reduced. Particularly, by using an oxide superconducting material which has been recently advanced in study, it is possible to produce a superconducting current path through which superconducting current flows at relatively high temperature.

An oxide superconductor has the largest critical current density $J_c$ in direction perpendicular to c-axes of its crystal lattices. Therefore, it is desirable that the superconducting current path through which superconducting current flows horizontally is formed of a c-axis orientated oxide superconductor thin film and the superconducting path through which superconducting current flows vertically is formed of oxide superconductor thin films of which c-axes are orientated horizontally. In this specification, this oxide superconductor thin film of which c-axes are orientated horizontally will be called an "a-axis orientated oxide superconductor thin film".

On the other hand, devices which utilize superconducting phenomena operate rapidly with low power consumption so that they have higher performance than conventional semiconductor devices. Like the superconducting current path, by using an oxide superconducting material, it is possible to produce a superconducting device which operates at relatively high temperature.

Josephson device is one of well-known superconducting device. However, since a Josephson device is a two-terminal device, a logic gate which utilizes Josephson devices becomes complicated. Therefore, three-terminal superconducting devices are more practical.

Typical three-terminal superconducting devices include two types of super-FET (field effect transistor). A first type of the super-FET includes a semiconductor channel, and a superconductor source electrode and a superconductor drain electrode which are formed closely to each other on both sides of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulator layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to a superconducting proximity effect, and is controlled by an applied gate voltage. This type of the super-FET operates at a higher speed with a low power consumption.

A second type of the super-FET includes a channel of a superconductor formed between a source electrode and a drain electrode on a substrate, so that a current flowing through the superconducting channel is controlled by a voltage applied to a gate formed above the superconducting channel.

Both of the super-FETs mentioned above are voltage controlled devices which are capable of isolating the output signal from the input signal and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few tens of nanometers, if the superconductor source electrode and the superconductor drain electrode are formed of the oxide superconductor material. However, it is very difficult to conduct a fine processing such as a fine pattern etching, so as to satisfy the very short channel distance mentioned above.

On the other hand, the super-FET having the superconducting channel has a large current capability, and the fine processing which is required to produce the first type of the super-FET is not needed to product this type of super-FET.

In order to obtain a complete ON/OFF operation, both of the superconducting channel and the gate insulating layer should have an extremely thin thickness. For example, the superconducting channel formed of an oxide superconductor material should have a thickness of less than five nanometers, and the gate insulating layer should have a thickness more than ten nanometers which is sufficient to prevent a tunnel current.

This extremely thin superconducting channel is insufficient for thickness as a source region and a drain region from and to which the superconducting current flows through the superconducting channel. Therefore, in the super-FET, a superconducting source region and a superconducting drain region having a relatively thick thickness should be arranged at the both side of the superconducting channel.

In this connection, the main current flows in parallel to the substrate through the superconducting channel and flows perpendicular to the substrate in the superconducting source region and superconducting drain region.

An oxide superconductor has the largest critical current density $J_c$ in direction perpendicular to c-axes of its crystal lattices. Therefore, it is desirable that the superconducting channel is formed of a c-axis orientated oxide superconductor thin film and the superconducting source region and the superconducting drain region are formed of a-axis orientated oxide superconductor thin films.

However, grain boundaries are generated at the interface between the c-axis orientated oxide superconductor thin film and the a-axis orientated oxide superconductor thin film, which introduce difficulties of superconducting current flowing. The grain boundaries sometimes form Josephson junctions which pass only tunnel current so that the current capability is limited and the input and output characteristics become nonlinear. If no Josephson junction is formed at the interface, Joule heat may be generated by the electric resistance formed at the interface, which causes the "quench" phenomenon. The c-axis orientated oxide superconductor thin film and the a-axis orientated oxide superconductor thin film may interfere with each other so as to degrade each other.

In the prior art, there has been proposed that a metal layer of Au, Ag, etc. is inserted between the c-axis orientated oxide superconductor thin film and the a-axis orientated oxide superconductor thin film so that the interface does not consist of the grain boundaries of the oxide superconductor. However, even if the metal layer is formed of Au or Ag, it still sustains electric resistance so that the "quench" may occur.

SUMMARY OF THE INVENTION

Accordingly, it is an object of the present invention to provide a superconducting thin film having a superconducting region constituted of an a-axis orientated oxide superconductor layer and a superconducting region constituted of a c-axis orientated oxide superconductor layer, which have overcome the above mentioned defects of the conventional ones.

Another object of the present invention is to provide a superconducting path utilizing the superconducting thin film, which have overcome the above mentioned defects of the conventional ones.

Still another object of the present invention is to provide an FET type superconducting device utilizing the superconducting thin film, which have overcome the above mentioned defects of the conventional ones.

The above and other objects of the present invention are achieved in accordance with the present invention by a superconducting thin film formed on a substrate, comprising an a-axis orientated oxide superconductor layer, a c-axis orientated oxide superconductor layer and an oxide semiconductor layer inserted between the a-axis orientated oxide superconductor layer and the c-axis orientated oxide superconductor layer, in contact with them in which superconducting current can flow between the a-axis orientated oxide superconductor layer and the c-axis orientated oxide superconductor layer through the oxide semiconductor layer by a so called long-range proximity effect.

A superconducting proximity effect is a phenomenon that superconducting current flows between two superconductors through a semiconductor or a normal conductor, if the two superconductors are set close enough to each other. The superconducting proximity effect usually occurs, when the two superconductors are arranged within a distance of a few times of the coherent length of the superconductor. However, superconducting current can flow between two oxide superconductors through some particular type oxide semiconductor, though they are located at a relatively long distance of some hundreds of nanometers. The present invention utilizes this so-called long-range proximity effect of the oxide superconductor.

The oxide semiconductor layer of the superconducting thin film in accordance with the present invention may have a thickness of 1 to 200 nanometers. Therefore, a fine processing technique is not necessary to form the oxide semiconductor layer.

Preferably, the oxide semiconductor layer is formed of $La_{1.5}Ba_{1.5}Cu_3O_{7-y}$ oxide semiconductor or $La_{1.5}Ca_{1.5}Mn_3O_{7-z}$ oxide semiconductor.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material and a Bi-Sr-Ca-Cu-O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation.

According to another aspect of the present invention, there is provided a superconducting current path comprising a substrate, a first and a second horizontal superconducting current paths formed of c-axis orientated oxide superconductor layers and stacked on the principle surface of the substrate, an insulator layer inserted between the first and second horizontal superconducting current paths so as to electrically isolate them, a vertical superconducting current path of an a-axis orientated oxide superconductor layer, which electrically connects the first and the second horizontal superconducting current paths, and oxide semiconductor layers inserted between the first and second horizontal superconducting current paths and the vertical superconducting current path in which superconducting current can flow between the first and the second horizontal superconducting current paths and the vertical superconducting current path through the oxide semiconductor layers by a long-range proximity effect.

According to still another aspect of the present invention, there is provided a superconducting device comprising a substrate, an extremely thin superconducting channel formed of a c-axis orientated oxide superconductor thin film on the principal surface of the substrate, a superconducting source region and a superconducting drain region of a relatively thick thickness formed of the a-axis orientated oxide superconductor on both sides of the superconducting channel separated from each other but electrically connected through the superconducting channel, so that a superconducting current can flow through the superconducting channel between the superconducting source region and the superconducting drain region, a gate electrode through a gate insulator on the superconducting channel for controlling the superconducting current flowing through the superconducting channel, and oxide semiconductor layers between the superconducting channel and the superconducting source region and between the superconducting channel and the superconducting drain region, which superconducting current pass by a long-range proximity effect.

The above and other objects, features and advantages of the present invention will be apparent from the following description of preferred embodiments of the invention with reference to the accompanying drawings.

BRIEF DESCRIPTION OF THE DRAWINGS

FIGS. 1A to 1E are diagrammatic sectional views for illustrating a process for manufacturing an embodiment of the superconducting current path in accordance with the present invention.

DESCRIPTION OF THE PREFERRED EMBODIMENTS

Embodiment 1

Figure 2A:
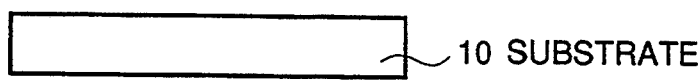
FIGS. 2A to 2F are diagrammatic sectional views for illustrating a process for manufacturing an embodiment of the super-FET in accordance with the present invention.

Referring to FIGS. 1A to 1E, a process for manufacturing an embodiment of the superconducting current path in accordance with the present invention will be described.

As shown in FIG. 1A, a substrate 10 having a substantially planar principal surface was prepared. This substrate 10 was formed of a SrTiO$_3$ (110) substrate or another insulator substrate such as a MgO (100) substrate.

As shown in FIG. 1B, a c-axis orientated Y$_1$Ba$_2$Cu$_3$O$_{7-\delta}$ oxide superconductor layer 1, a SrTiO$_3$ insulator layer 17 and a c-axis orientated Y$_1$Ba$_2$Cu$_3$O$_{7-\delta}$ oxide superconductor layer 2 were deposited and stacked on the principal surface of the substrate 10 by for example an off-axis sputtering, a reactive co-evaporation, an MBE (molecular beam epitaxy), a CVD, etc. The c-axis orientated Y$_1$Ba$_2$Cu$_3$O$_{7-\delta}$ oxide superconductor layers 1 and 2 have a thickness of about 400 nanometers and respectively constituted superconducting current paths through which superconducting current flew in parallel to the substrate 10. The insulator layer 17 might be formed of MgO instead of SrTiO$_3$. The condition of forming the c-axis orientated Y$_1$Ba$_2$Cu$_3$O$_{7-\delta}$ oxide superconductor layers 1 and 2 by off-axis sputtering was as follows:

| Sputtering Gas | Ar: 90% |
| --- | --- |
|  | O$_2$: 10% |
| Total pressure | 5 × 10$^{-2}$ Torr |
| Temperature of the substrate | 700° C. |

Then, as shown in FIG. 1C, a portion 30 of the stacked structure including the c-axis orientated Y$_1$Ba$_2$Cu$_3$O$_{7\delta}$ oxide superconductor layers 1 and 2 and the insulator layer 17 was etched by a reactive ion etching process using a chloric gas so that a surface of the substrate 10 was exposed.

A vertical current path, such as a via hole, which connects the c-axis orientated oxide superconductor layers 1 and 2 will be formed at the portion 30.

Thereafter as shown in FIG. 1D, a La$_{1.5}$Ba$_{1.5}$Cu$_3$O$_{7-y}$ oxide semiconductor layer 8 having a thickness of 100 nanometers was deposited on the c-axis orientated Y$_1$Ba$_2$Cu$_3$O$_{7-\delta}$ oxide superconductor layer 2 and the exposed portion of the substrate 10 by a sputtering process. The condition of forming the La$_{1.5}$Ba$_{1.5}$Cu$_3$O$_{7-y}$ oxide semiconductor layer 8 by sputtering was as follows:

| Sputtering Gas | Ar: 50% |
| --- | --- |
|  | O$_2$: 50% |
| Total pressure | 5 × 10$^{-2}$ Torr |
| Temperature of the substrate | 700° C. |

The oxide semiconductor layer 8 may be formed of La$_{1.5}$Ca$_{1.5}$Mn$_3$O$_{7-z}$ oxide semiconductor instead of La$_{1.5}$Ba$_{1.5}$Cu$_3$O$_{7-y}$ oxide semiconductor. An oxide superconductor in contact with these oxide semiconductors shows a long-range proximity effect so that the superconducting current flows through a relatively long distance in the semiconductors.

Finally, as shown in FIG. 1E, an a-axis orientated Y$_1$Ba$_2$Cu$_3$O$_{7-\delta}$ oxide superconductor layer 13 was foraged on the La$_{1.5}$Ba$_{1.5}$Cu$_3$O$_{7-y}$ oxide semiconductor layer 8 by an MBE process so that the superconducting current path in accordance with the present invention was completed. An MBE condition under which the a-axis orientated Y$_1$Ba$_2$Cu$_3$O$_{7-\delta}$ oxide superconductor layer 13 was formed was as follows:

| Molecular beam source | Y: 1250° C. |
| --- | --- |
|  | Ba: 600° C. |
|  | Cu: 1040° C. |
| Pressure | 5 × 10$^{-5}$ Torr |
| Temperature of the substrate | 630° C. |

The a-axis orientated Y$_1$Ba$_2$Cu$_3$O$_{7-\delta}$ oxide superconductor layer 13 was electrically connected to the c-axis orientated oxide superconductor layers 1 and 2 through the La$_{1.5}$Ba$_{1.5}$Cu$_3$O$_{7-y}$ oxide semiconductor layer 8, since the superconducting current passed the La$_{1.5}$Ba$_{1.5}$Cu$_3$O$_{7-y}$ oxide semiconductor layer 8 by the long-range proximity effect. Namely, two horizontal superconducting current paths of the c-axis orientated Y$_1$Ba$_2$Cu$_3$O$_{7-\delta}$ oxide superconductor layers 1 and 2 was electrically connected through a vertical superconducting current path of the a-axis orientated Y$_1$Ba$_2$Cu$_3$O$_{7-\delta}$ oxide superconductor layer 13.

The above mentioned superconducting path in accordance with the present invention has a La$_{1.5}$Ba$_{1.5}$Cu$_3$O$_{7-y}$ oxide semiconductor layer between horizontal superconducting current paths of c-axis orientated oxide superconductor layers and a vertical superconducting current path of a a-axis orientated oxide superconductor layer. Therefore, there is no grain boundary of the oxide superconductor at the interfaces between the horizontal superconducting current paths and the vertical superconducting current path. The superconducting current can pass the La$_{1.5}$Ba$_{1.5}$Cu$_3$O$_{7-y}$ oxide semiconductor layer by a long-range proximity effect so that there is no Josephson junction nor electric resistance at the interfaces. By this, the current capability and characteristics of the superconducting path can be improved.

Embodiment 2

Referring to FIGS. 2A to 2F, a process for manufacturing an embodiment of the superconducting device in accordance with the present invention will be described.

As shown in FIG. 2A, there was prepared a substrate 10, similar to the substrate 10 of the Embodiment 1.

Figure 2B:
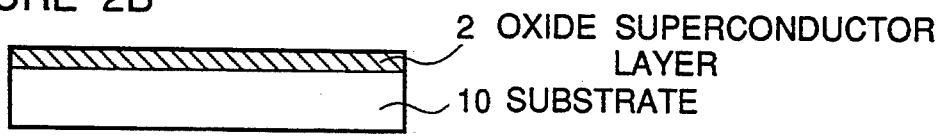

As shown in FIG. 2B, a c-axis orientated Y$_1$Ba$_2$Cu$_3$O$_{7-\delta}$ oxide superconductor layer 2 having a thickness of about 5 nanometers was formed on a principal surface of the substrate 10 by for example an off-axis sputtering. The off-axis sputtering was performed under the same condition as that of the Embodiment 1.

Figure 2C:
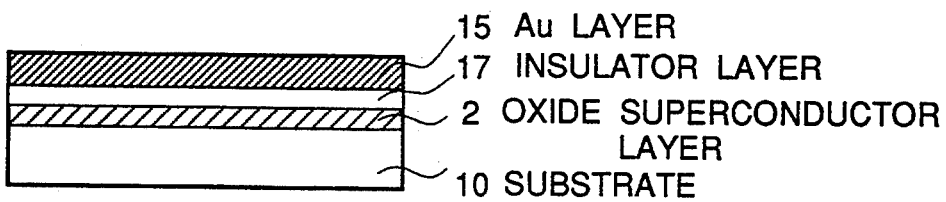
Figure 2D:
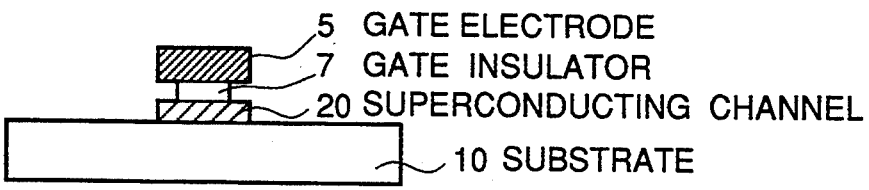

Then, as shown in FIG. 2C, a MgO insulator layer 17 having a thickness of 10 nanometers and an Au layer 15 were deposited on the c-axis orientated $Y_1Ba_2Cu_3O_{7-\delta}$ oxide superconductor layer 2. The Au layer 15, the insulator layer 17 and the c-axis orientated $Y_1Ba_2Cu_3O_{7-\delta}$ oxide superconductor layer 2 were processed by an Ar-ion etching so that a gate electrode 5, a gate insulator 7 and a superconducting channel 20 were formed on a center portion of the substrate 10, as shown in FIG. 2D. In this connection, the gate insulator 7 was side-etched in comparison with the gate electrode 5, so that the gate insulator 7 had a length shorter than that of the gate electrode 5.

The gate insulator 7 can be formed of $SrTiO_3$ and the gate electrode can be formed of Ag.

Figure 2E:
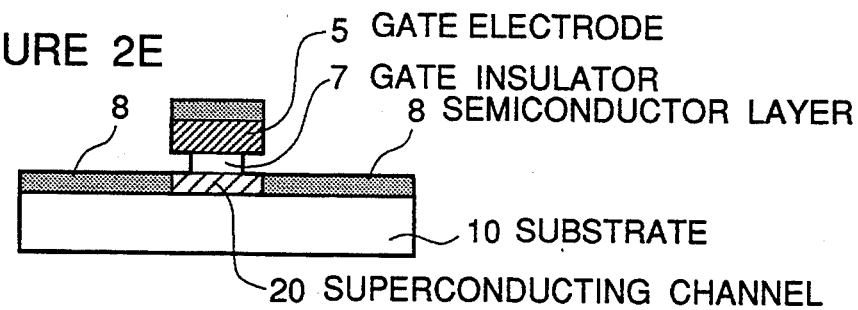

Thereafter, as shown in FIG. 2E, a $La_{1.5}Ba_{1.5}Cu_3O_{7-y}$ oxide semiconductor layer 8 having almost the same thickness as the superconducting channel 20 was deposited on the the substrate 10 at the both sides of the superconducting channel by a sputtering process. The sputtering was performed under the same condition as that of the Embodiment 1.

The oxide semiconductor layer 8 may be formed of $La_{1.5}Ca_{1.5}Mn_3O_{7-z}$ oxide semiconductor instead of $La_{1.5}Ba_{1.5}Cu_3O_{7-y}$ oxide semiconductor. An oxide superconductor in contact with these oxide semiconductors shows a long-range proximity effect so that the superconducting current flows through a relatively long distance in the semiconductors.

Figure 2F:
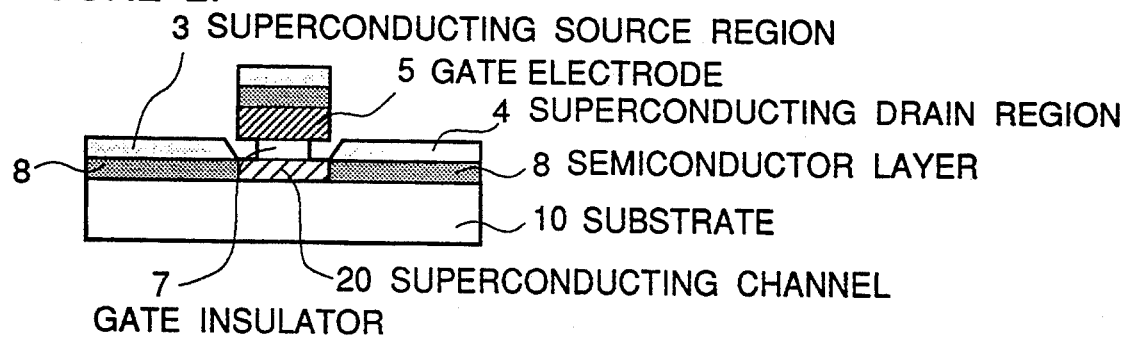

Finally, as shown in FIG. 2F, a superconducting source region 3 and a superconducting drain region 4 of an a-axis orientated $Y_1Ba_2Cu_3O_{7-\delta}$ oxide superconductor thin film were formed on the $La_{1.5}Ba_{1.5}Cu_3O_{7-y}$ oxide semiconductor layer 8 at both sides of the gate insulator 7 and on the gate electrode 5, respectively. The MBE condition under which the superconducting source region 3 and the superconducting drain region 4 are formed is same as the Embodiment 1.

A metal source electrode and a metal drain electrode might be formed on the superconducting source region 3 and the superconducting drain region 4 respectively, if necessary. With this, the super-FET in accordance with the present invention was completed.

The above mentioned super-FET in accordance with the present invention has a $La_{1.5}Ba_{1.5}Cu_3O_{7-y}$ oxide semiconductor layer 8 between the superconducting channel 20 and the superconducting source region 3 and between the superconducting channel 20 and the superconducting drain region 4. Therefore, there is no grain boundary of the oxide superconductor at the interfaces between the superconducting channel 20 and the superconducting source region 3 and between the superconducting channel 20 and the superconducting drain region 4. The superconducting current can pass the $La_{1.5}Ba_{1.5}Cu_3O_{7-y}$ oxide semiconductor layer 8 by a long-range proximity effect so that there is no Josephson junction nor electric resistance at the interfaces. By this, the current capability and characteristics of the super-FET can be improved.

In the above mentioned embodiments, the oxide superconductor thin film can be formed of not only the Y-Ba-Ca-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconductor structure comprising:
   a first oxide superconductor layer;
   a second oxide superconductor layer with an axis orientation different from said first superconductor layer; and
   an oxide semiconductor layer formed between said first and second oxide superconductor layers to provide a superconducting current path between the first and second oxide superconductor layers.

2. A superconducting current path comprising:
   a substrate;
   a first and a second horizontal superconducting current path formed of c-axis orientated oxide superconductor layers and stacked on a principal surface of the substrate;
   an insulator layer inserted between the first and second horizontal superconducting current paths so as to electrically isolate them;
   a vertical superconducting current path of an a-axis orientated oxide superconductor layer electrically connecting the first and the second horizontal superconducting current paths; and
   oxide semiconductor layers inserted between the first and second horizontal superconducting current paths and the vertical superconducting current path, the oxide semiconductor layers forming a superconducting current path between the first and the second horizontal superconducting current paths and the vertical superconducting current path through which a superconducting current flows by a long-range proximity effect.

3. A superconducting device comprising:
   a substrate;
   a superconducting channel formed of a c-axis orientated oxide superconductor thin film on a principal surface of the substrate, the superconducting channel having a predetermined thickness so as to realize a complete ON/OFF operation;
   a superconducting source region and a superconducting drain region formed of a-axis orientated oxide superconductor on both sides of the superconducting channel, the source region and the drain region being separated from each other but electrically connected through the superconducting channel, forming a superconducting current path through the superconducting channel between the superconducting source region and the superconducting drain region;
   a gate electrode provided on a gate insulator above the superconducting channel for controlling the superconducting current flowing through the superconducting channel; and
   oxide semiconductor layers between the superconducting channel and the superconducting source region and between the superconducting channel and the superconducting drain region, forming a superconducting current path through which a superconducting current passes by a long-range proximity effect.

4. A superconducting device claimed in claim 3 wherein the predetermined thickness of the superconducting channel is less than or equal to 5 nanometers.

5. A superconductor structure comprising:
an a-axis orientated oxide superconductor layer;
a c-axis orientated oxide superconductor layer; and
an oxide semiconductor layer formed to electrically connect the a-axis orientated oxide superconductor layer and the c-axis orientated oxide superconductor layer, the oxide semiconductor layer forming a superconducting current path between the a-axis orientated oxide superconductor layer and the c-axis orientated oxide superconductor layer through which a superconducting current flows by a long-range proximity effect, said structure preventing a formation of at least one of a Josephson junction and electrical resistance in the superconducting current path.

6. A structure claimed in claim 5, wherein the oxide semiconductor layer has a thickness of 1 to 200 nanometers.

7. A structure claimed in claim 5, wherein the oxide semiconductor layer is formed of $La_{1.5}Ba_{1.5}Cu_3O_{7-y}$ oxide semiconductor or $La_{1.5}Ca_{1.5}Mn_3O_{7-z}$ oxide semiconductor.

8. A structure claimed in claim 5 wherein the oxide superconductor is formed of high-$T_c$ high critical temperature) oxide superconductor, particularly, formed of a high-$T_c$ copper-oxide type compound oxide superconductor.

9. A structure claimed in claim 8 wherein the oxide superconductor is formed of oxide superconductor material selected from the group consisting of a Y-Ba-Cu-O compound oxide superconductor material and a Bi-Sr-Ca-Cu-O compound oxide superconductor material.

* * * * *